United States Patent [19]
Zambrano et al.

[11] Patent Number: 5,622,876
[45] Date of Patent: Apr. 22, 1997

[54] METHOD FOR MAKING MONOLITHIC INTEGRATED BRIDGE TRANSISTOR CIRCUIT

[75] Inventors: Raffaele Zambrano, San Giovanni La Punta; Sergio Palara, Aci Castello, both of Italy

[73] Assignee: Consorzio per la Ricerca sulla Microelettronica nel Mezzogiorno, Catania CT, Italy

[21] Appl. No.: 458,083

[22] Filed: Jun. 1, 1995

Related U.S. Application Data

[62] Division of Ser. No. 124,245, Sep. 20, 1993, Pat. No. 5,464,993.

[30] Foreign Application Priority Data

Sep. 18, 1992 [EP] European Pat. Off. .............. 92830506

[51] Int. Cl.$^6$ .................................................. H01L 2/265
[52] U.S. Cl. ............................................ 438/135; 438/357
[58] Field of Search ................................. 437/6, 31, 41, 437/43, 50, 56, 57, 58, 59, 74

[56] References Cited

U.S. PATENT DOCUMENTS

| | | | |
|---|---|---|---|
| 4,589,004 | 5/1986 | Yasuda et al. | 357/23.4 |
| 4,866,495 | 9/1989 | Kinzer | 357/23.4 |
| 4,896,196 | 1/1990 | Blanchard et al. | 357/23.4 |
| 4,949,142 | 8/1990 | Contiero et al. | 357/23.4 |
| 5,023,678 | 6/1991 | Kinzer | 357/23.4 |
| 5,023,691 | 6/1991 | Hagino | 357/43 |
| 5,055,721 | 10/1991 | Majumdar et al. | 307/570 |
| 5,072,278 | 12/1991 | Paparo et al. | 357/43 |
| 5,107,151 | 4/1992 | Cambier | 307/570 |
| 5,123,746 | 6/1992 | Okado . | |
| 5,231,563 | 7/1993 | Jitaru . | |
| 5,273,917 | 12/1993 | Sakurai | 437/40 |
| 5,315,497 | 5/1994 | Severinsky . | |
| 5,317,180 | 5/1994 | Hutter et al. . | |
| 5,446,300 | 8/1995 | Amato et al. | 257/343 |
| 5,464,993 | 11/1995 | Zambrano et al. | 257/140 |

FOREIGN PATENT DOCUMENTS

A0451286 10/1991 European Pat. Off. . .

OTHER PUBLICATIONS

Patent Abstracts of Japan, vol. 15, No. 236, Jun. 18 1989.
Miyazaki et al., "A Novel High Voltage 3–Phase Monolithic Inverter IC" 3rd Int'l Symp. Power Semiconductor Devices, Apr. 22, 1991.
"Power losses of the cascade connection compared to a single common–emitter bipolar transistor"Electronic Engineering, Nov. 1981, p. 67.

*Primary Examiner*—John Niebling
*Assistant Examiner*—Long Pham
*Attorney, Agent, or Firm*—Robert Groover; Betty Formby; Matthew Anderson

[57] ABSTRACT

A monolithically integrated, transistor bridge circuit of a type suiting power applications, comprises at least one pair of IGBT transistors (M1, M2) together with vertically-conducting bipolar junction transistors transistors (T1, T2). These IGBT transistors are laterally conducting, having drain terminals (9, 19) formed on the surface of the integrated circuit (1), and through such terminals, they are connected to another pair of transistors (T1, T2) of the bipolar type.

14 Claims, 3 Drawing Sheets

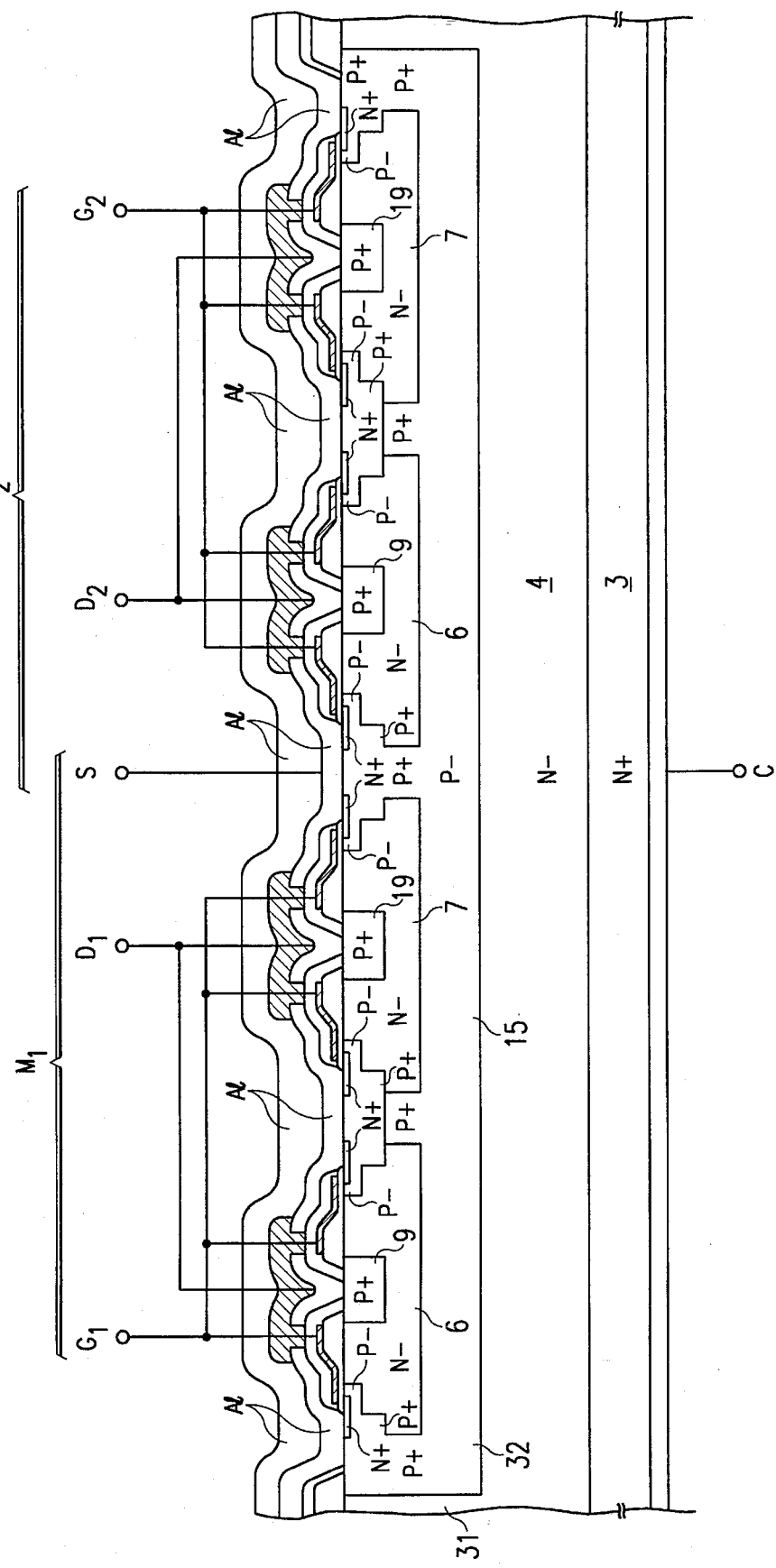

METHOD FOR MAKING MONOLITHIC INTEGRATED BRIDGE TRANSISTOR CIRCUIT

CROSS REFERENCE TO RELATED APPLICATION

This is a divisional of Ser. No. 08/124,245, filed Sep. 20, 1993, now U.S. Pat. No. 5,464,993

This application claims priority from EPC App'n 92830506.9, filed Sep. 18, 1992, which is hereby incorporated by reference.

BACKGROUND AND SUMMARY OF THE INVENTION

This invention relates to a monolithically integrated, transistor bridge circuit and a method for the manufacture thereof.

More particularly, the invention relates to a bridge circuit made up of power transistors operated at a high voltage which may exceed 250 volts, although the description which follows will make reference to an application of this kind merely for convenience of illustration.

As is known, bridge circuits are widely used for a large number of applications on account of their ability to equalize currents being supplied to an electric load.

For such specific applications, integrated circuits incorporating bipolar transistors or field-effect transistors in a half-bridge configuration have been provided in the past. A circuit of that type is described, for example, in Italian Patent No. IT 1204522 of SGS-Thomson, which is hereby incorporated by reference.

Another known technical solution is described in European Patent Application No. 91830513.7 (which is hereby incorporated by reference), which relates to an integrated bridge circuit of the type designed to optimize power losses. The approach of this application has proved advantageous by virtue of its high conversion efficiency and its ability to operate on high currents, but does not provide for integration of all the power components on a single chip.

The present invention advantageously provides a transistor bridge circuit which has such structural and functional features as to enable monolithic integration of high-voltage elements, while overcoming the current limitations of prior art embodiments. This is accomplished by combining high current-carrying IGBT devices, in combination with junction bipolar devices, into the integrated circuit. Preferably the IGBT devices are connected between output nodes and a positive power supply connection, and the junction bipolar devices are connected between the output nodes and ground.

The present invention also advantageously provides a bridge circuit which can be readily manufactured, and a process for manufacturing it.

BRIEF DESCRIPTION OF THE DRAWING

The present invention will be described with reference to the accompanying drawings, which show important sample embodiments of the invention and which are incorporated in the specification hereof by reference, wherein:

FIG. 4 illustrates schematically an exemplary application of the variation shown in FIG. 3.

DESCRIPTION OF THE PREFERRED EMBODIMENTS

Figure 1:
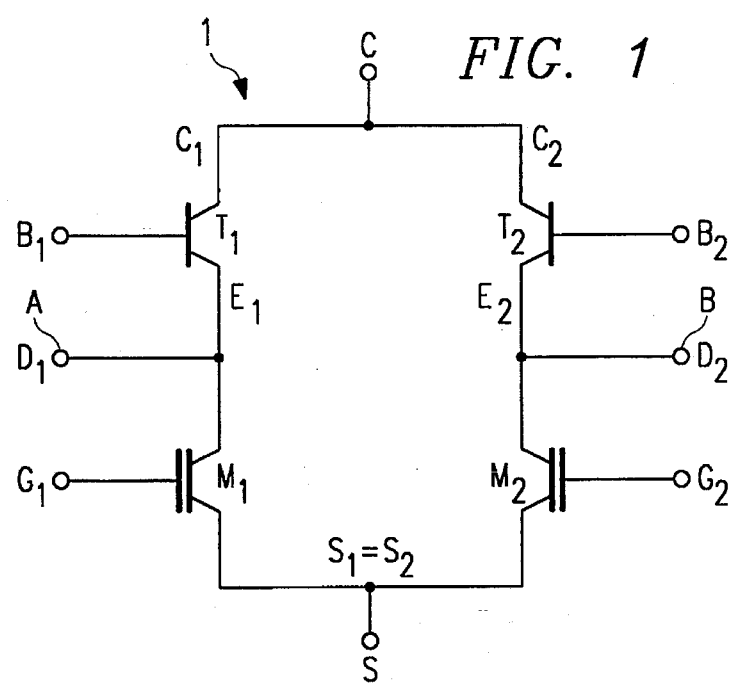
FIG. 1 is a diagrammatic representation of a bridge circuit according to the invention.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

With reference to the drawing figures, generally and schematically shown at 1 is a bridge circuit embodying this invention in the mixed bipolar/MOS technology and being integrated monolithically on a wafer of semiconductor silicon.

The circuit 1 comprises two opposing input nodes A, B and two opposing supply nodes C, S. Connected between the first supply node C and each of the input nodes A and B, is a corresponding bipolar transistor T1, T2.

In a similar manner, between the second supply node S and each of the input nodes A, B is a corresponding power electronic device M1, M2. More particularly, each device M1, M2 is an insulated-gate bipolar transistor, commonly known by the acronym IGBT (Insulated-Gate Bipolar Transistor), which is constructed in the MOS technology.

The respective gate terminals of such IGBT transistors M1, M2 are denoted by the references G1 and G2, while the respective base terminals of the bipolar transistors T1, T2 are denoted by the references B1, B2.

The upper portion of the bridge 1, comprising the bipolar transistors T1 and T2, is connected to the lower portion, comprising the IGBT devices M1, M2, through respective connections of the emitters E1, E2 of the first transistor pair to the drain terminals D1, D2 of the second pair.

The collectors C1, C2 of the first transistor pair T1, T2 are connected together into the first output node C.

The source terminals S1, S2 of the second transistor pair M1, M2 are connected together into the second output node S.

Figure 2:
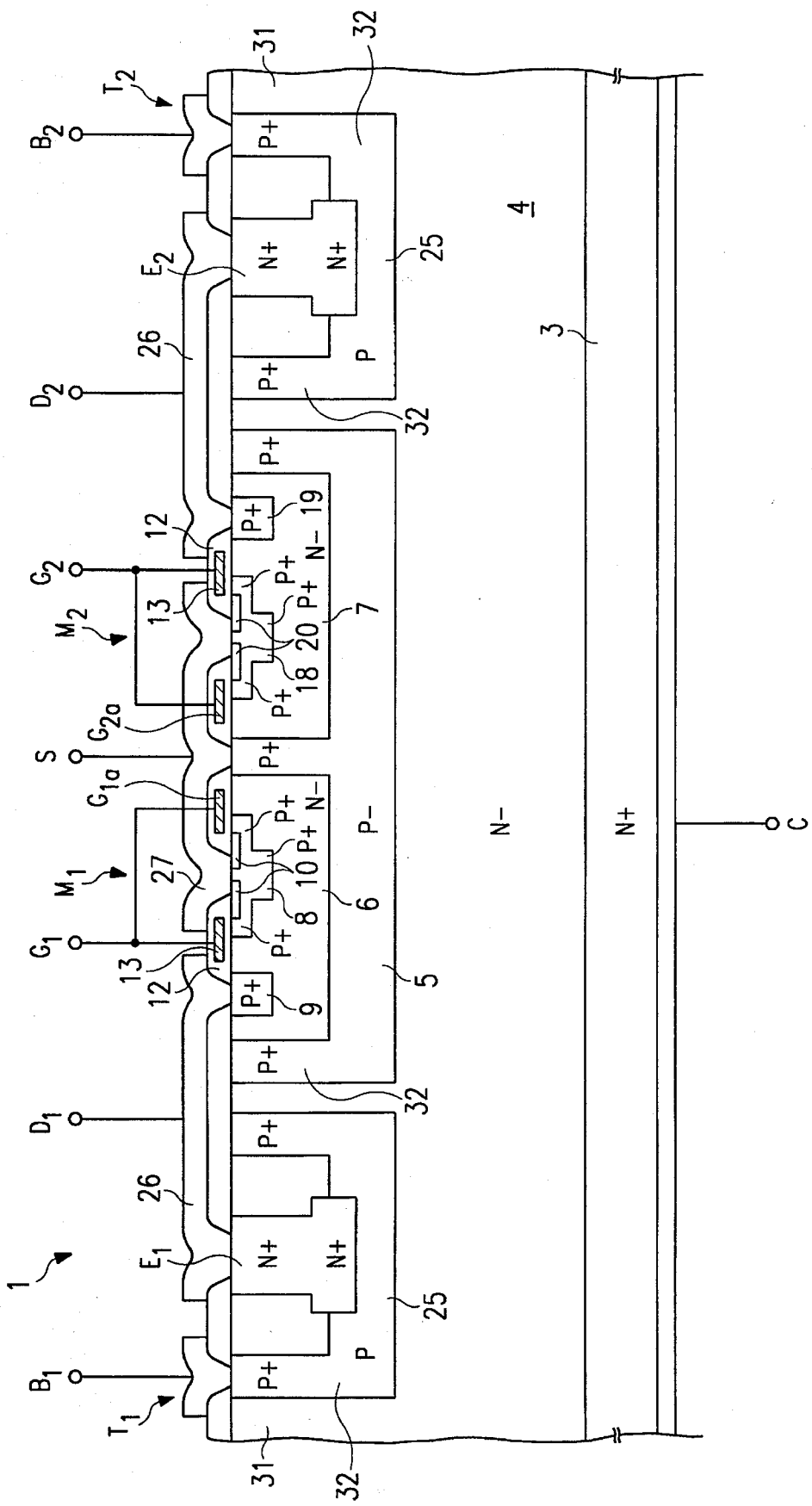
FIG. 2 shows, schematically and drawn to an enlarged scale, a vertical section through the structure of a monolithic semiconductor device incorporating the bridge circuit of this invention.

With specific reference to the example shown in FIG. 2, shown therein are the details of the monolithic structure of this circuit 1 as yielded by the manufacturing process of this invention.

Provided over the semiconductor wafer is a monocrystalline silicon substrate 3, being doped N+ and having an epitaxial layer 4 with conductivity N− formed thereon.

Formed within this epitaxial layer 4 is a P-doped isolation well 5 adapted to receive and hold the IGBT transistors M1 and M2.

To create such transistors M1, M2, the well 5 is provided with two discrete epitaxial regions 6 and 7, doped N−.

In each of said regions 6 and 7, two discrete areas, doped P+, are diffused. These areas have been referenced 8 and 9 for transistor M1 and 18 and 19 for transistor M2.

The areas 8 and 18 constitute the so-called deep bodies of the two transistors, M1 and M2, while the areas 9 and 19 are the respective drain active areas of each transistor M1, M2. Associated with the areas 8 and 18 are also the related bodies doped P−.

Two additional discrete regions, doped N, are formed, as by diffusion, within each of the two bodies 8 and 18.

These regions represent source active areas of the IGBT devices. Indicated at 10 are two sources of transistor M1, and at 20 two sources of transistor M2.

Between each respective source area 10, 20 and drain area 9, 19, the gate terminal G1, G2 of the associated transistor is formed in a manner known per se. By providing two source active areas in each body 8, 18, the perimeter of the channel region can be doubled.

In fact, terminals G1a and G2a are provided which are connected in parallel with each gate G1, G2.

Each of the gate terminals G1, G1a, G2, G2a is formed by a layer 13 of polycrystalline silicon deposited over an insulating oxide layer 12.

Also provided is a shorting link between the source regions 10 and 20 and the corresponding body 8, 18 of the associated transistor.

As shown in FIG. 2, a metallization layer 27 interconnects the body/source shorts and the well 5, to be then run to the output node 8.

It may be noted that, with the structure just described and illustrated, two lateral conduction IGBT devices M1, M2 are provided which are characterized by having their drain terminals 9, 19 at the semiconductor surface.

The circuit 1 structure is completed by the provision of the bipolar transistors T1, T2 located at the sides of the well 5 which encloses and isolates the IGBT devices.

The transistors, T1 and T2, are formed in a manner known per se using a conventional process.

The transistors T1 and T2 are each formed of a base region 25, doped P, wherein a corresponding emitter region E1 or E2, doped N+, is diffused.

Advantageously, each emitter E1, E2 is connected, through a metallization 26, to the corresponding drain terminal 9, 19 of the IGBT transistor, as also illustrated by the diagram in FIG. 1.

Figure 3:
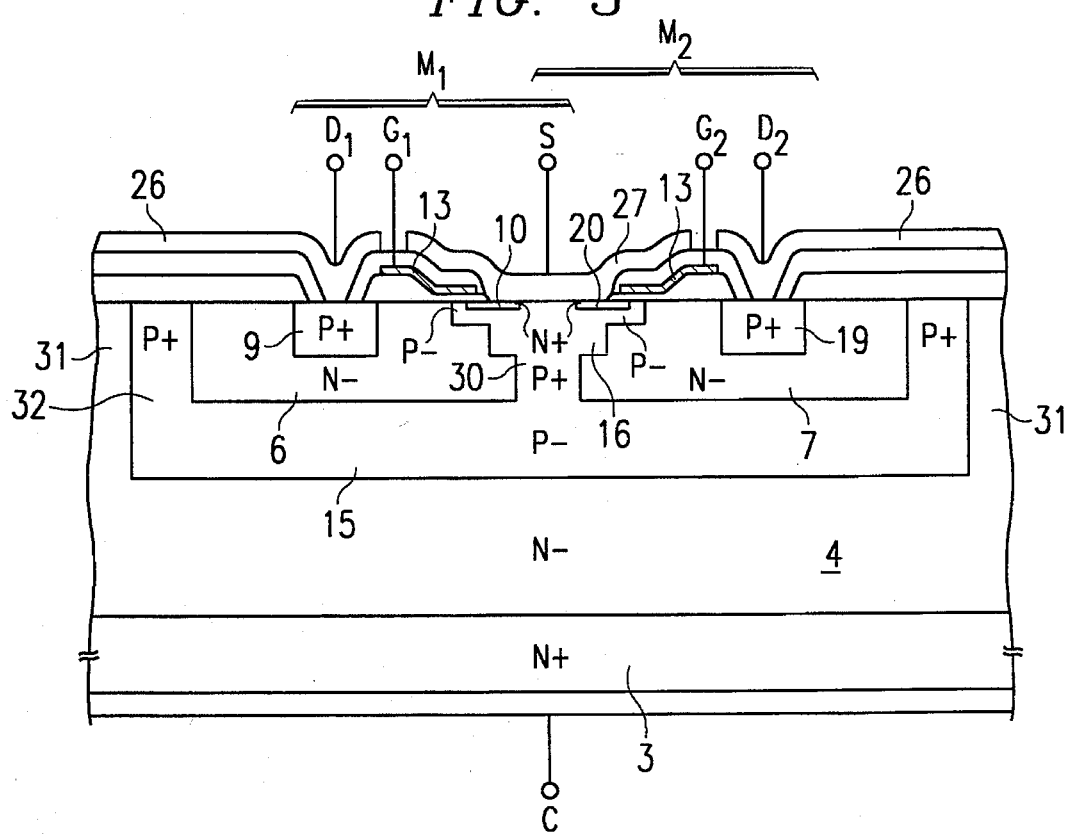
FIG. 3 is a diagrammatic detail view of a modified embodiment of the device shown in FIG. 2.

In the interest of a simplification of the structure herein, a portion of a modified embodiment of the inventive circuit is depicted, to a slightly enlarged scale, in FIG. 3 which has a single body region 16 in common with an isolation well 15.

It should be noted that in the embodiment of FIG. 3, elements with the same construction and operation as in the previously described embodiment are denoted by the same references.

A single isolation well 15 accommodates both the first IGBT transistor and the second.

Formed within the well 15 are the two epitaxial regions 6 and 7. The drain 9 of the first transistor M1 is diffused through the first region 6, whilst the second region 7 accommodates the drain 19 of the second transistor M2.

A single diffused body region 16 is, on the other hand, shared by the two transistors and connected to the well 15 through a region 30 (FIG. 3) bounded by the epitaxial regions 6 and 7.

Formed within the last-mentioned body region 16 are the sources 10 and 20, each on the side of the corresponding transistor M1 or M2.

The gate terminals G1 and G2 are formed conventionally between the respective drain and source terminals, 9–10 and 19–20, of each transistor M1, M2.

This, the second, embodiment affords IGBT integrated transistors of a specially compact design, thereby minimizing the silicon area occupied by the integrated circuit.

Advantageously, since the IGBT transistors are to pass high currents, the structure described with reference to FIG. 3 may be duplicated to connect in parallel several transistors of one type.

Shown in FIG. 4 is an embodiment wherein each transistor, M1 or M2, is constructed by associating two of the semiconductor devices shown in FIG. 3, in parallel together.

To summarize, the drain regions 9 and 19, doped P+, and the source regions 10 and 20, have been adequately connected together.

This basic structure is, moreover, duplicated such that each of the transistors M1 and M2 is composed of another two IGBT transistors parallel connected together. To this aim, a double metallization level can be employed as shown in FIG. 4.

To summarize the process steps which are implemented by the bridge circuit of this invention, the essential steps involved in the manufacturing process will be suitably listed sequentially herein below.

Subsequently to growing the epitaxial layer 4 over the substrate 3, the process sequence includes the formation of the buried layer, doped P, which is to provide the well 5 and base regions 25 for the bipolar transistors T1, T2.

Thereafter, the buried layers, doped N+, for the emitters E1, E2 are formed, followed by the growth of a second epitaxial layer 31 and the definition, within this epitaxial layer 31, of isolation regions 32 which bound the portions 6 and 7 of said epitaxial layer 31.

At this stage, a series of oxide deposition, photomasking and chemical etching operations are performed to define the deep body areas 8 and 18, and the drain active areas 9, 19 bounded by field oxide.

The semiconductor is then covered with a layer 12 of polycrystalline silicon wherein pits are defined to provide the source active areas 10 and 20, doped N+.

Subsequently, the body regions doped P− are defined.

Conventional final steps of contact opening, metallization and passivation complete the manufacturing sequence.

The bridge circuit of this invention does solve, in all of its embodiments, the technical problem, and achieves a number of advantages, foremost of which is that it can ensure a high current flow to the load.

Another advantage resides in the smaller integrated circuit area occupied and consequent savings in layout.

It should be additionally noted that the solution provided by this invention can operate effectively at high voltages, even in excess of 250 volts, and still be highly stable in operation.

Note that the IGBT devices, in the presently preferred embodiment, are being used in a lateral-current-flow mode of operation. This has the advantage that (as compared with high-voltage MOSFETs) the lateral IGBTs can modulate the conductivity of the N-type layer, and therefore reduced voltage drops can be achieved in the saturation regime.

In the embodiment shown, control terminal $G_1$ is connected to $B_2$, and $G_2$ is connected to $B_1$. The signals at B1 and B2 are in phase opposition.

In an application, terminal S would typically be connected to ground, terminal C would be connected to Vcc, and the load (typically a motor) would be connected between D1 and D2.

The disclosed structure can be used for various application, including not only control of small motors from mains power, but also other high-voltage applications such as power inversion.

In a sample process flow, an N− epitaxial layer is grown on an N+ substrate. The P-type buried layer, bipolar base regions, and N-type buried layer are then formed, and another N− epitaxial layer is then grown. An N-well is then formed (e.g. by implanting 2.5E12 cm$^{-2}$ of P at 160 KeV, followed by growth of 500 Å of oxide at the surface). A P-well is then formed (if needed for CMOS), followed by isolation and sinker diffusions. A P-type deep-body diffusion is then formed (which will provide the drain for the IGBT transistor). Field oxide is then formed, to expose "active" locations where active devices may be formed. This is followed by fabrication of polysilicon layer, P− body region, source regions, contacts, metal, and passivation (overcoat). Of course, this is only one example of a possible fabrication sequence, and it will readily be appreciated that skilled process engineers may vary this sequence in many ways.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A process for manufacturing a monolithically integrated, transistor bridge circuit, comprising the steps of:

forming a pair of insulated-gate-bipolar transistors having source regions of a first conductivity type, and forming a pair of bipolar transistors having emitter regions of said first conductivity type; said pair of insulated-gate-bipolar transistors and said pair of bipolar transistors being integrated monolithically in a common monolithic structure;

forming an isolation well which completely surrounds said pair of insulated-gate-bipolar transistors with a junction which is not part of said pair of insulated-gate-bipolar transistors nor of said pair of bipolar transistors; and interconnecting said pair of insulated-gate-bipolar transistors with said pair of bipolar transistors in a bridge configuration.

2. A process according to claim 1, wherein said isolation well is obtained by steps which include an initial step of forming a buried layer with a first type of dopant.

3. A process according to claim 1, comprising a subsequent step of forming a single body region extended to the isolation well by diffusion.

4. The method of claim 1, wherein said bipolar transistors have buried emitters.

5. The method of claim 1, wherein said first conductivity type is N.

6. A method for fabricating an integrated driver circuit, comprising the steps, in no particular order, of:

forming a pair of insulated-gate-bipolar transistors having predominantly lateral current flow, and having source regions of a first conductivity type connected to a first power supply connection; and forming a pair of bipolar transistors having predominantly vertical current flow, and having emitter regions of said first conductivity type connected to a second power supply connection;

each said insulated-gate-bipolar transistors being entirely surrounded, and separated from said bipolar transistors, by at least one isolating junction; and interconnecting said pair of insulated-gate-bipolar transistors with said pair of bipolar transistors in a bridge configuration.

7. The method of claim 6, wherein said bipolar transistors have buried emitters.

8. The method of claim 6, wherein said first conductivity type is N.

9. The process of claim 1, wherein said pair of bipolar transistors have collectors, said collectors being connected together into a first ouput node, and wherein said insulated-gate-bipolar transistors have source terminals, said source terminals being connected together into a second output node.

10. The process of claim 1, wherein said insulated-gate-bipolar transistors have drain terminals, said drain terminals being connected to said emitter regions of said bipolar transistors.

11. The process of claim 1, wherein said pair of bipolar transistors are located on opposite sides of said pair of insulated-gate-bipolar transistors.

12. The method of claim 6, wherein said pair of bipolar transistors have collectors, said collectors being connected together into a first output node, and wherein said insulated-gate-bipolar transistors have source terminals, said source terminals being connected together into a second output node.

13. The method of claim 6, wherein said pair of bipolar transistors are located on opposite sides of said pair of insulated-gate-bipolar transistors.

14. The method of claim 6, wherein said insulated-gate-bipolar transistors have drain terminals, said drain terminals being connected to said emitter regions of said bipolar transistors.

* * * * *